United States Patent [19]

Brewer

[11] Patent Number: 5,105,425
[45] Date of Patent: Apr. 14, 1992

[54] ADAPTIVE OR FAULT TOLERANT FULL WAFER NONVOLATILE MEMORY

[75] Inventor: Joe E. Brewer, Severna Park, Md.

[73] Assignee: Westinghouse Electric Corp., Pittsburgh, Pa.

[21] Appl. No.: 458,932

[22] Filed: Dec. 29, 1989

[51] Int. Cl.$^5$ .......................................... G01R 31/28
[52] U.S. Cl. .................................. 371/11.1; 365/200; 365/201
[58] Field of Search ................... 371/11.1, 11.2, 11.3; 365/200, 201; 364/245.3, 268.9, 944.61, 970.1

[56] References Cited

U.S. PATENT DOCUMENTS

| | | | |
|---|---|---|---|
| 3,781,826 | 12/1973 | Beausoleil | 371/11.1 |
| 3,803,560 | 4/1974 | DeVoy et al. | 364/200 |
| 3,913,072 | 10/1975 | Catt | 364/200 |
| 4,398,248 | 8/1983 | Hsia et al. | 364/200 |
| 4,503,535 | 3/1985 | Budde et al. | 371/11.3 |
| 4,833,677 | 5/1989 | Jarwala et al. | 371/11.1 |
| 4,847,615 | 7/1989 | McDonald | 340/825.02 |
| 4,868,789 | 9/1989 | MacDonald | 365/200 |
| 4,893,280 | 1/1990 | Gelsomini et al. | 365/230.05 |
| 4,943,966 | 7/1990 | Giunta et al. | 371/11.1 |

OTHER PUBLICATIONS

"Introduction to VLSI Systems", Mead & Conway, 1980, Sec. 3.10, pp. 79-82, Sec. 3.11, pp. 82-88, and Sec. 6.2 pp. 190-192.

"Digital Logic and Computer Design", Mano. 1979, Sec. 5-8, pp. 189-195.

Primary Examiner—Charles E. Atkinson
Attorney, Agent, or Firm—D. Schron

[57] ABSTRACT

A method and apparatus for providing a flexible and adaptive communication link from one of four wafer input/output channels respectively located on each of four sides of a silicon wafer to a predetermined internal memory-logic site includes in a matrix array of identical memory-logic sites located on the wafer. A new linkage path can be formed, if necessary, each time a memory-logic is accessed. Each memory-logic site is capable of communicating with any of its neighboring sites, which includes not only its four opposing sides, but also its four adjacent diagonal sites, by one of a plurality of input/output site ports. A programmed external controller coupled to a computer, for example, works from the edge of the wafer through the selected wafer input/output channel and links to any designated memory-logic site for the purpose of data storage, data retrieval or test.

20 Claims, 5 Drawing Sheets

1

ADAPTIVE OR FAULT TOLERANT FULL WAFER NONVOLATILE MEMORY

BACKGROUND OF THE INVENTION

This invention relates generally to semiconductor memory devices for storing digital data and more particularly to an adaptive or fault tolerant full wafer nonvolatile digital memory having an array of identical self controlled sites containing both memory and logic circuitry.

The manufacture of wafer scale integrated circuits is well known in the art. Typically the wafer contains additional circuit elements which can be switched into place to replace circuits which are faulty because of defects in the material or defects inducted as a result of manufacture. The switching process or procedure may involve fabrication of special connecting or disconnecting features by metal depositions, ion implants, laser cutting, or laser fusing. Alternatively, the switching can be accomplished by using conventional circuit elements such as transistors which can be programmed to form a desired end circuit configuration.

The use of wafer scale circuits often also involves redundancy for the purpose of working around faults which may occur while the circuit is installed in a system. Here the switching processes or procedures almost always rely on the use of conventional circuit elements such as transistors.

In the narrower area of systolic array technology, the concept of an array of identical processors communicating with nearest neighbor processors has also evolved. The capability of switching the links to nearest neighbors has been actively studied for the purpose of switching out of the array any faulty processors and the concept of forming electrical circuit links between identical circuits arranged in an array has also been used as a defect avoidance scheme to manufacture wafer scale dynamic memory. However, individual memory sites are connected together in a permanently fixed spiral to form a large serial memory.

It is an object of the present invention, therefore, to provide an improvement in fault tolerant semiconductor circuitry.

It is another object of the present invention to provide an improvement in large semiconductor memory devices by providing a fault tolerant block oriented random access addressing and switching capability which can be used for avoidance of material and process inducted defects.

It is a further object of the invention to provide a large semiconductor memory device capable of tolerating circuit failures in the field by providing a flexibility of the block oriented random access addressing and switching capability.

SUMMARY

Briefly, the foregoing and other objects are achieved in accordance with the subject invention by a method and apparatus for providing a flexible and adaptive communication link from one of four wafer input/output channels respectively located on each of four sides of a silicon wafer to any one of a plurality of internal memory-logic sites included in a matrix of identical memory-logic sites located on the wafer. Each memory-logic site is capable of communicating with its neighboring sites including its four opposing sites, and when desirable to its four diagonal sites, by one of a plurality of input/output site ports located adjacent the neighboring sites. A programmed external controller coupled to a computer, for example, works from the edge of the wafer through the selected wafer input/output channel and links to any designated memory-logic site for the purpose of data storage, data retrieval or test. The communication from the input/output channel to the selected site is not dedicated so that defective sites within the matrix are by-passed as they appear by utilizing reconfigurable, possibly different, fault free routes around the defective site every time a site is accessed by testing, selecting and linking to an adjacent fault free memory-logic site via the closest available operable port. There is no permanently fixed path between the wafer input/output channel utilized and the selected memory site due to the fact that an ongoing adaptive process is implemented so that each time a defect occurs in a data path, a new path is automatically configured each time a site is accessed without human intervention through logic implemented by a programmed logic array included in each memory site. Moreover, a row of memory within a designated storage site is utilized as the basic selected storage element and the use of a cyclical redundancy code within a row permits column failures to be tolerated.

BRIEF DESCRIPTION OF THE DRAWINGS

The following detailed description of the invention will be more readily understood when considered together with the following drawings wherein.

DETAILED DESCRIPTION OF THE INVENTION

Figure 1:
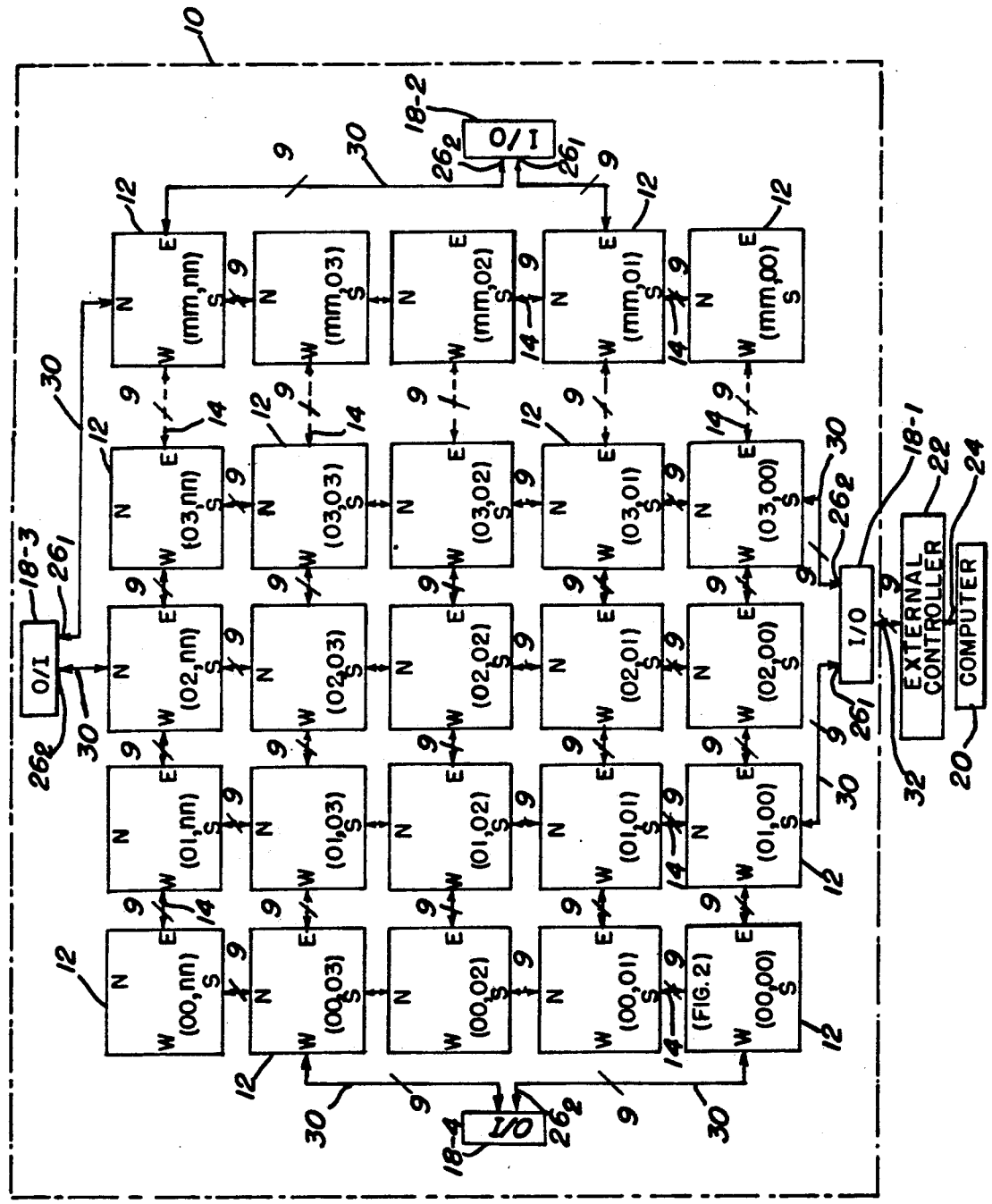
FIG. 1 is an electrical block diagram generally illustrative of the preferred embodiment of the subject invention.
Figure 2:
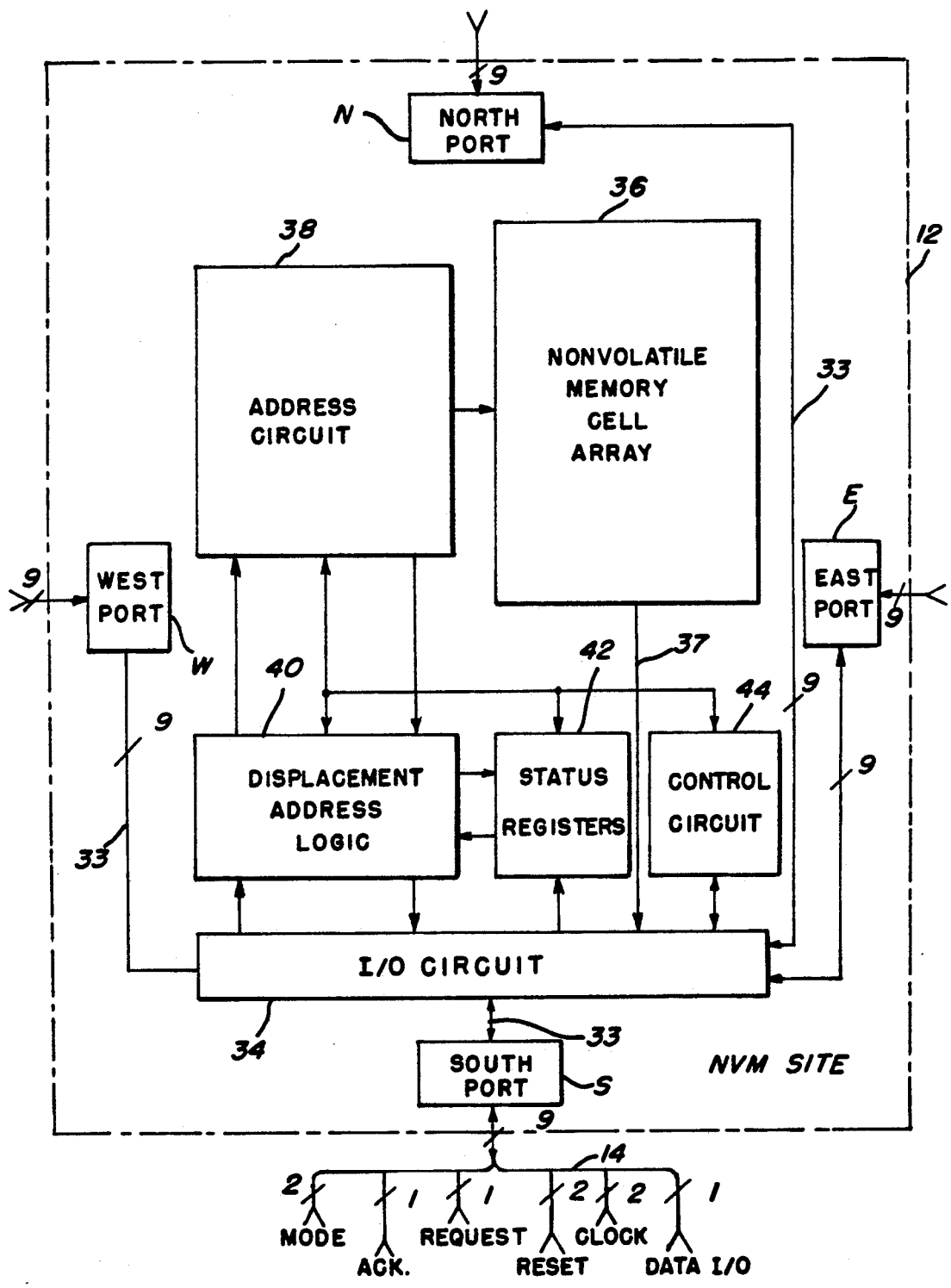
FIG. 2 is an electrical block diagram further illustrative of one of the plurality of identical memory-logic sites shown in FIG. 1.

Referring now to the drawings wherein like reference numerals refer to like elements throughout, in FIG. 1 reference numeral 10 designates a full wafer nonvolatile memory (FW-NVM) fabricated on a relatively large silicon wafer which is typically four inches in diameter. The FW-NVM 10 additionally includes a plurality of identical memory-logic sites 12, the details of which are shown in FIG. 2. The sites 12 are arranged in a rectilinear X-Y array referred to as a matrix, with each of the sites 12 being identified by a two digit X-Y coordinate system such that the first or lower left corner site is identified as (00,00), while the last or upper right hand corner site is identified as (mm,nn). Each of the sites 12 are adapted to communicate with the nearest neighboring sites by means of a 9-bit signal bus 14 respectively connected to four orthogonal site input/output (I/O) signal ports which are designated East(E), West(W), North(N) and South(S).

As shown, the E port connects to the W port of the site 12 on the right, the N port connects to the S port of the site 12 above it, the W port connects to the E port of the site 12 to the left, and the S port connects to the N port of the site 12 below it, as shown. When desirable, communication could also be made with diagonal neighboring sites providing eight accessible neighboring sites in all. This, however, would require an additional set of NE, NW, SE, SW ports at the North East, North West, South East and South West corners of each site 12. The interior sites 12 communicate only with the nearest neighbor sites, while the sites along the outside edges of the FW-NVM have at least one port E, W, N, S, and possibly two, at the corners of the matrix which are adapted to be coupled to one of four wafer I/O channels 18-1, 18-2, 18-3 and 18-4 located on the outer perimeter of the wafer 10 and being arranged adjacent the four sides of the sites 12.

The four I/O channels 18-1, 18-2, 18-3 and 18-4 are located along mutually opposite edges of the FW-NVM 10 for selective connection to a host computer 20, for example, through a programmed external controller 22. The computer 20 uses the FW-NVM 10 in much the same manner as a conventional magnetic disk store by establishing a serial communication link to one or more of the sites 12 through the external controller and one of the wafer I/O channels 18-1, 18-2, 18-3, 18-4. The computer 20 will send a data request over a bus 24 to the controller 22 which acts to store or retrieve a requested data block from a site 12 via an established communication link which will then receive or transmit the data back to the computer 20 via the controller and the I/O channel, e.g. I/O channel 18-1 shown in FIG. 1, connected thereto.

During manufacture of the FW-NVM 10, catastrophic failures such as power to ground shorts are removed permanently by a hard technique such as laser cutting or special feature formation. Subsequently, a probe test including a laser is made to accomplish a permanent (hard) repair and/or disconnect of a site, after which the laser permanently sets appropriate status flags. The probe test also determines which of the four wafer I/O channels 18-1, 18-2, 18-3, 18-4 have two working interfaces $26_1$ and $26_2$ for connection to one of the sites 12 along the edge of the matrix where a connection is made thereto via a 9 bit signal bus 30. For the sake of explanation, all four wafer I/O channels 18-1, 18-2, 18-3, 18-4 are shown connected to two edge sites 12, with the wafer I/O channel 18-1 being coupled to the external controller 22 by means of an 8 bit signal bus 32.

As illustrated, the two interfaces $26_1$ and $26_2$ of the wafer I/O channel 18-1 respectively connect to the S port of the site (01,00), while the interface $26_2$ connects to the S port of the site (03,00) of the bottom row. Moving counterclockwise around the wafer 10, the interfaces $26_1$ and $26_2$ of the wafer I/O channel 18-2 respectively connect to the E port of the site (mm,01) and the E port of the site (mm,nn). With respect to the wafer I/O channel 18-3 on the upper edge of the wafer 10, the interfaces $26_1$ and $26_2$ respectively connect to the N port of the site (mm,nn) in the upper right hand corner of the array and the N port of the site (02,nn) in the upper left portion of the array. With respect to the left side of the wafer, the interfaces $26_1$ and $26_2$ of the wafer I/O channel 18-4 respectively connect to the W port of the site (00,03) and the W port of the site (00,00). The connection of the interfaces is shown being made to nonadjacent sites 12 of varying spans in order to illustrate that during fabrication several defective sites are more likely to occur in the same region of the FW-NVM 10 as opposed to sites 12 which are relatively remote from one another.

During use, one of the two connected interfaces $26_1$ and $26_2$ of the selected channel 18-1, for example as shown in FIG. 1, is used for seeking a communication path around defective sites, as they occur, to a predetermined site 12 in the matrix designated by the computer 20.

Referring now to FIG. 2, shown is a block diagram of one of the plurality of identical binary digital memory-logic sites 12. Each site 12 in addition to having four quadrature I/O communication ports E, W, N, S, which are adapted to couple to either an adjacent site 12 or a wafer I/O channel 18-1, 18-2, 18-3, 18-4, through respective 9 bit data buses 33 and an I/O circuit 34, additionally includes a nonvolatile memory cell array 36 and its associated address circuit or X-Y decoder 38, and a displacement address digital logic circuit 40 and a set of associated flip-flop type of status registers 42. The logic circuit 40 and status registers 42 are implemented by a programmable logic array for providing a sequential finite state machine also simply referred to as a "state machine".

Finite state machines are generally known and comprise sequential electronic machines of the type shown and described, for example, in a textbook publication entitled, *Introduction to VLSI Systems*, Mead and Conway, published by the Addison-Wesley Publishing Company in 1980 at Sec. 3.11, pp. 82–88 entitled, "Finite-State Machines" and further at Sec. 6.2, pp. 190–192 entitled, "Alternative Control Structures." Programmable logic arrays are also well known functional integrated circuit structures which are disclosed not only in the above cited Mead and Conway publication at Sec. 3.10, pp. 79–82 entitled "The programmable Logic Array", but also in Sec. 5–8, pp. 189–195, "Programmable Logic Array (PLA)" of a textbook entitled *Digital Logic and Computer Design*, M. Morris Mano, Prentice-Hall, Inc., 1979.

A control circuit 44 is also included in each memory and logic site 12 in order to provide self control of three operational modes, namely a self-test mode, an access mode, and a retrieve mode. In the self-test mode, a status test is made to determine the integrity of the site and operates to set status flags which can be sensed through the I/O circuit 34 and E, W, N, and S ports coupled thereto via the buses 33. In the access mode, a data block is entered or loaded from the host computer 20 (FIG. 1) into a predetermined address of the memory cell array 36 via a bidirectional data bus 37 which is shown coupled to the I/O circuit 34. The retrieve mode is a complementary mode with respect to the access mode and operates to read out or unload a block of data contained in the memory cell array 36 back to the computer 20.

FIG. 2 also shows the type of signals which are carried on the 9 bit signal bus 14 which is coupled to one or all of the ports E, W, N, S so as to activate the "state machine" contained in the site, load a program for executing a series of commands into the control circuit 44, call for execution of a program, conduct a self-test procedure, load/unload the memory cell array 36 or simply pass signals to one of the remaining E, W, N, S ports for communication with an adjacent site 12 on the wafer 10 (FIG. 1). As shown, the inputting and outputting of data requires 1 bit of the signal bus 14, while a clock signal requires 2 bits, a reset operation requires 2 bits, a request and acknowledgment for effecting a handshake requires 1 bit each, and a mode select signal requires 2 bits, totaling 9 bits in all.

Prior to discussing the manner in which the sites 12 on the FW-NVM 10 operate in a "pass through" or "link" mode by the internal logic contained in the displacement address logic 40 (FIG. 2), master reset operation will first be considered.

Figure 3:
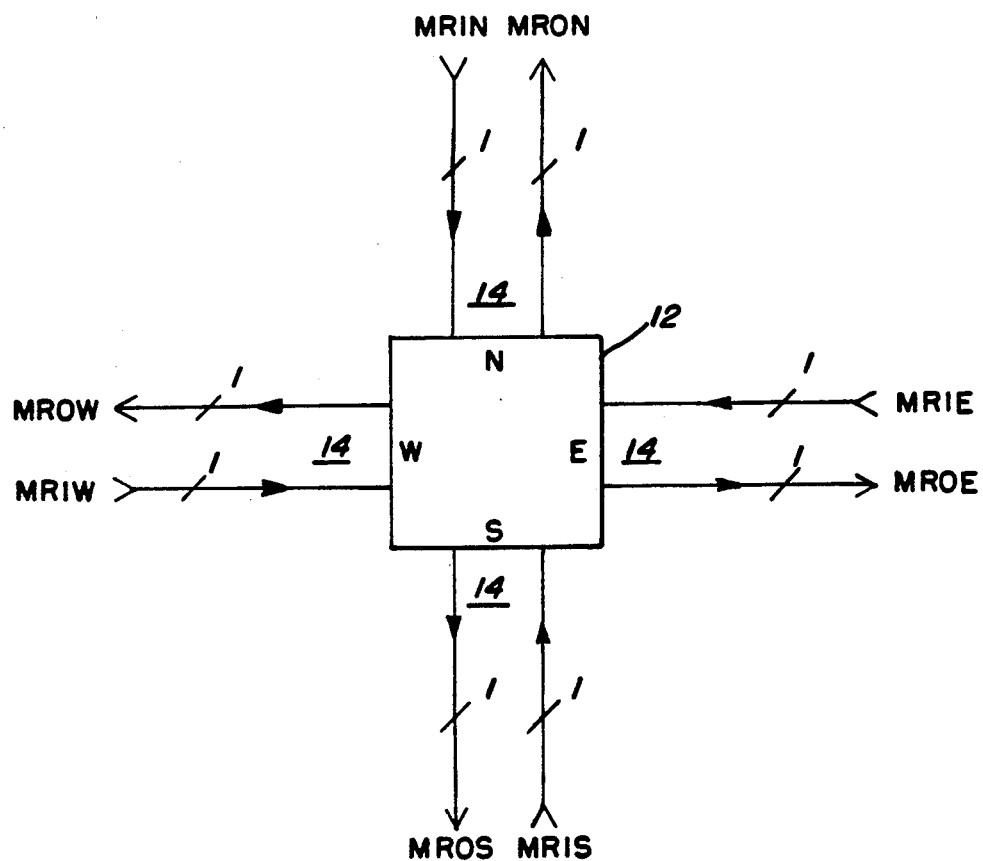
FIG. 3 is an electrical block diagram illustrative of the reset operation provided by the invention.

Referring now to FIG. 3, a master reset (MR) signal is employed at the initialization of the full wafer 10 and is routed through each of the sites 12 comprising the array shown in FIG. 1. Since there are four ports E, W, N, S ports on each wafer, there are redundant paths to every site 12 on the wafer 10. The danger associated with the master reset signal is that a fault could cause a false MR signal. If that fault is not contained, it could force all sites 12 into an initial or home state indicative of a power down condition. Accordingly, every site 12 includes internal logic in the control circuit 44, for example, to limit the spread of the false MR signal.

The following strategy is employed to output master reset MR signals only if two relevant input MR signals are applied to a site 12. FIG. 3 discloses the master reset (R) signals associated with one memory-logic site 12. The logic notation includes a two letter code which is added to the signal name to identify signal direction relative to the site, input (I) or output (O) and a character to identify the site port, i.e. N, E, S, W. The master reset MR signals outputted from the North (N), the East (E), the South (S) and West (W) ports accordingly are be expressed as:

$$MRON = MRIE.MRIS + MRIE.MRIW + MRIS.MRIW \quad (1)$$

$$MROE = MRIS.MRIW + MRIS.MRIN + MRIW.MRIN \quad (2)$$

$$MROS = MRIW.MRIN + MRIW.MRIE + MRIN.MRIE \quad (3)$$

$$MROW = MRIN.MRIE + MRIN.MRIS + MRIE.MRIS \quad (4)$$

Figure 4B:
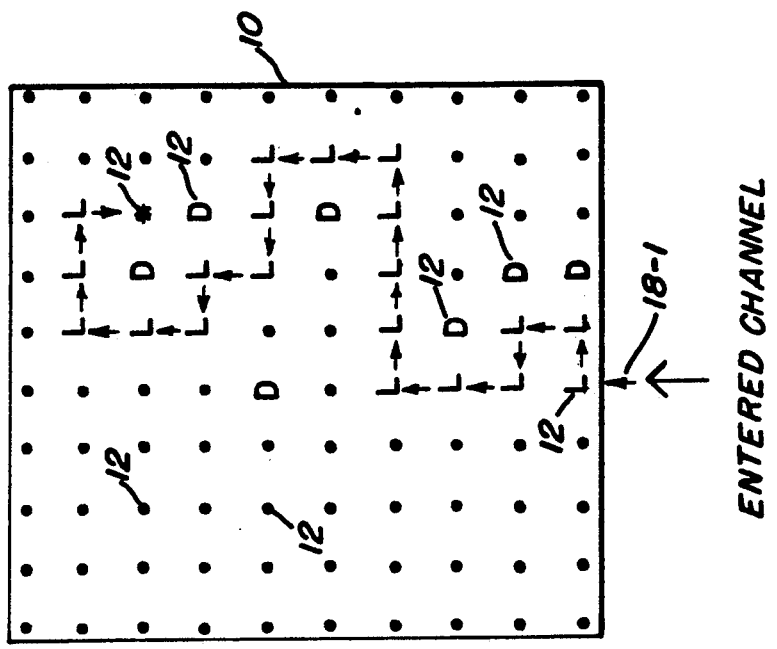
FIGS. 4A and 4B are diagrams helpful in understanding the operation/of the subject invention.
Figure 4A:
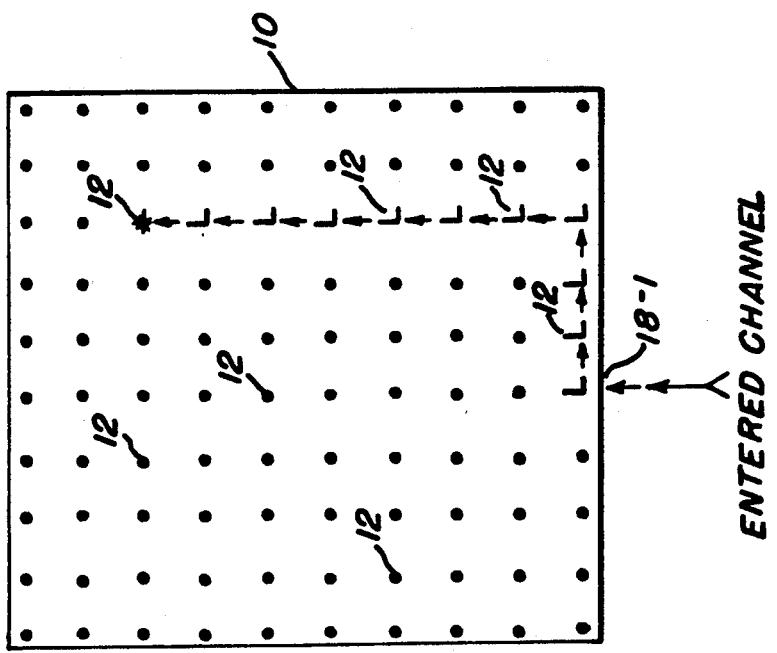

Next reference to FIGS. 4A and 4B which are illustrative of the concept of linking of memory and logic sites 12 sequentially from a wafer I/O channel 18-1, for example, to a selected designated end site 12 on the FW-NVM 10. FIG. 4A illustrates a condition where no defective sites are encountered from the entered I/O channel 18-1, to an end point site 12 located in the upper right hand quadrant of the wafer 10. It can be seen that a linking from one operative site (L) to another proceeds by first moving to the right in the horizontal direction and then upwardly in the vertical direction. This convention is arbitrary, however, since the linking path could first be made vertically and then horizontally if desired.

Considering now FIG. 4B, there is illustrated a condition where several defective sites (D) occur in the communications path to the same end site 12 as shown in FIG. 4A. The linking path shown in FIG. 4B proceeds from the wafer I/O channel 18-1 to the right where the first defect site (D) is encountered, at which point the linking path proceeds vertically where two defect sites D above and to the right are encountered, at which point the path turns left and then up around the third defect site D where it progresses to the right again and around a fourth defect site D. The linking path again proceeds back to the left, up and to the left again, and clockwise around the defect site D immediately to the left of the end site 12.

It should be noted that no fixed path is provided, but rather it consists of an ongoing adaptive process each time a site is accessed so that when a defect D occurs, a new path is formed via L sites 12 around the defect site.

The method by which site linking is achieved will now be explained. A self-test is performed on the FW-NVM 10 at power turn-on. A portion of the test involves each site testing itself and the reliability of its four input/output ports N, E, S, and W, whereupon respective port fault status flags will be set electrically (soft) to indicate malfunctions thereof. For example, a binary "0" state is indicative of an operative or functional port or site, while a binary "1" state is indicative of an inoperative or malfunctioning port or site. This is implemented by way of the status registers 42 (FIG. 2) so that the displacement address logic 40 can test the binary states of the port fault status flags of its neighboring sites 12 to determine if a given port can be accessed. Additionally, each site logic 40, when necessary, can also be implemented to set "blockage status" flags in the status register 42 to record whether or not a linkage attempt was made through a given port and was unsuccessful which would then allow the logic 40 to make another routing attempt as will be subsequently explained. Thus both permanent (hard) and electrical (soft) techniques can be employed to set status flags.

The algorithm by which a communications path to a desired site 12 is generated includes an end site address (DSA) being designated by the external controller 22 (FIG. 1) in X, Y coordinates (ii,jj). Then, depending upon the site to which the wafer I/O channel 18-1, for example, is connected, the first site, for example, (01,00) checks the status of the four neighboring sites (02,00), (01,01), and (00,00) and depending upon the end site desired, for example, DSA = (03,03), a displacement address (DA) is determined by taking the difference between the desired site address (DSA) and the present site address (PSA). Thus where it is desired to link from site PSA (01,00) to DSA (03,03), the site displacement address (DA) would be DA = (03,03) − (01,00) (+02, +03). Assuming a convention where + designates subsequent movement to the right and up and where − designates movement to the left or downward, a movement of two columns to the right and three rows up could be required to reach the designated site (03, 03).

A detailed notation can be defined where displacement address (DA) consists of an X displacement (DX) and a Y displacement (DY), which can be written as (DA) = (DX, DY). The magnitudes of these quantities are defined as dX and dY, while the signs of these quantities are defined as sX and sY. Thus, in the above noted example where the displacement address (DA) = (+02, +03), sX = +, dX = 02, sY = + and dY = 03.

The algorithm implemented by the subject invention accordingly operates to sequentially proceed from one site 12 to the next, loading a respective site displacement address (DA) at each site which is followed by testing the operational integrity or status of the immediately adjacent sites. Depending on the test results sensed by the binary state of the port status flags of the adjacent sites, an E, W, N, or S site port on an adjacent operative site 12 is selected. The present DA is suitably incremented or decremented and thereafter transferred i.e.

loaded into memory via the selected port to the next site 12. This process repeats itself from site to site until a DA =(00,00) which is indicative of the destination address of the required end site 12 on the wafer 10.

Preferably the magnitude of dX is reduced first, followed by the magnitude of dY. However, this is arbitrary and can be reversed, if desired, or a combination of both can be utilized so that a zig-zag path is achieved.

Figure 5:
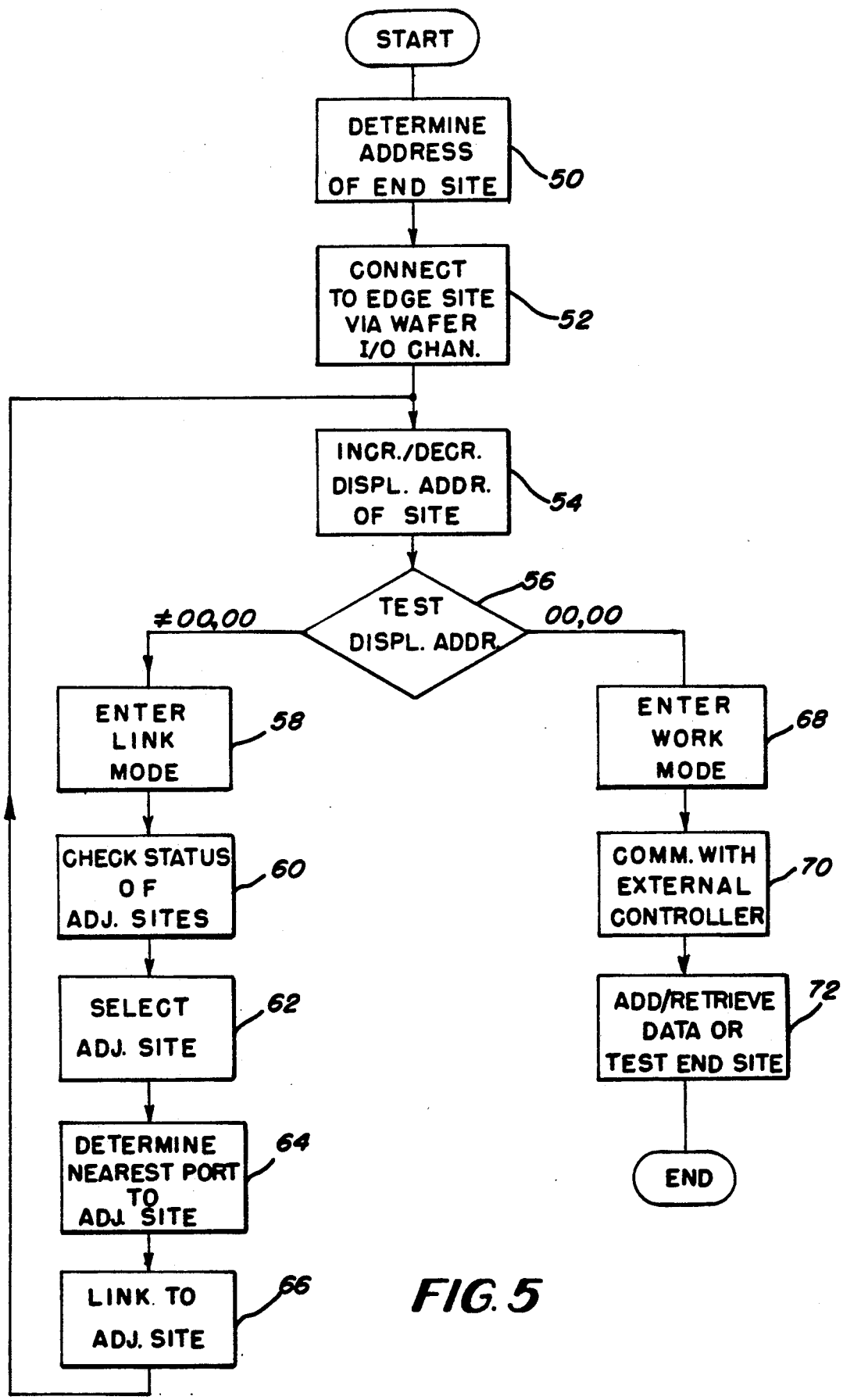
FIG. 5 is a flow chart illustrative of the operation of the invention shown in FIGS. 1 and 2.

The linking process can further be illustrated by reference to the flow chart shown in FIG. 5 wherein step 50, for example, denotes that the first step comprises determining the address of the end or destination site 12 on the FW-NVM 10, which is then followed by step 52 of connecting to an edge site on the wafer by means of one of the wafer I/O channels 18-1, 18-2, 18-3 or 18-4. Following this, the displacement address of a particular site 12 is incremented or decremented which is followed by a testing of the displacement address to determine whether or not DA =00,00. If not, the linking mode is entered as shown by reference numeral 58 which is followed by a check of the status of the adjacent sites as shown by step 60, followed by a selection of an adjacent site, as indicated by step 62. Next the nearest port to the adjacent site is determined as shown by step 64, followed by to the adjacent site as shown by step 66, whereupon the process repeats itself until the displacement address DA =00,00, at which point a work mode is entered as shown by step 68. This is followed by communication of the end site 12 with the external controller 22 (FIG. 1) as shown by step 70. Following this, data is read into or out of the designated end site or it is tested as shown by step 72.

The following Table 1 presents a simplified set of decision rules for the site linkage logic implemented. The input variables are, for example, sX, sY, the comparison result of dX:dY and the status flags for the site ports N, E, S and W. The output results are to select an output port (N, E, S or W) and thereafter properly modify and transmit the displacement address:

TABLE I

Simplified Site Linkage Logic Decision Rules

| | INPUT VARIABLES | | | | | | | OUTPUT DECISION | | |
|---|---|---|---|---|---|---|---|---|---|---|
| Rule # | sX | sY | dX:dY | Status Flags | | | | Select Port | X Change | Y Change |
| | | | | N | E | S | W | | | |
| 1 | + | X | ≧ | X | 0 | X | X | E | −1 | 0 |
| 2 | − | X | ≧ | X | X | X | 0 | W | +1 | 0 |
| 3 | X | + | < | 0 | X | X | X | N | 0 | −1 |
| 4 | X | − | < | X | X | 0 | X | S | 0 | +1 |
| 5 | + | + | ≧ | 0 | 1 | X | X | N | 0 | −1 |
| 6 | + | − | ≧ | X | 1 | 0 | X | S | 0 | +1 |
| 7 | − | + | ≧ | 0 | X | X | 1 | N | 0 | −1 |
| 8 | − | − | ≧ | X | X | 0 | 1 | S | 0 | +1 |
| 9 | + | + | < | 1 | 0 | X | X | E | −1 | 0 |
| 10 | − | + | < | 1 | X | X | 0 | W | +1 | 0 |
| 11 | + | − | < | X | 0 | 1 | X | E | −1 | 0 |
| 12 | − | − | < | X | X | 1 | 0 | W | +1 | 0 |

X = don't care

Table I reveals that a linkage path can be stated in a fairly condensed manner. In fact, if two bits are recorded for each site in the linkage, the entire path can be specified. All that is required to be determined at each site is the proper exit port where, for example:

00 =N, 01 =E, 10 =S and 11 =W.

Thus the controller 22 can store deterministic physical addresses as a string of two bit characters. If it is desired to link, for example, from site 06,01 to site 01,07 and there are no faults present in intermediate the sites, the displacement address DA loaded into site 06,01 will be −05 =06 and the link sequence will be as follows:

| Step | Site | DA | Rule | Exit |
|---|---|---|---|---|
| A | 06, 01 | −05, +06 | #3 | N |
| B | 06, 02 | −05, +05 | #2 | W |
| C | 05, 02 | −04, +05 | #3 | N |
| D | 05, 03 | −04, +04 | #2 | W |
| E | 04, 03 | −03, +04 | #3 | N |
| F | 04, 04 | −03, +03 | #2 | W |
| G | 03, 04 | −02, +03 | #3 | N |
| H | 03, 05 | −02, +02 | #2 | W |
| I | 02, 05 | −01, +02 | #3 | N |
| J | 02, 06 | −01, +01 | #2 | W |
| K | 01, 06 | −00, +01 | #3 | N |
| L | 01, 07 | −00, +00 | | |

Consider another example where a plurality of defective sites exists in the routing path at sites 02,04; 03,04; and 04,04. During the initial power-on self-test sequence, these sites will have caused flags to be set in the adjacent sites 01,04; 02,05; 03,05; 04,05; 05,04; 04,03; 03,03; and 02,03. Under such conditions, the following link sequence would occur:

| Step | Site | DA | N | E | S | W | Rule | Exit |
|---|---|---|---|---|---|---|---|---|
| A | 06, 01 | −05, +06 | 0 | 0 | 0 | 0 | #3 | N |
| B | 06, 02 | −05, +05 | 0 | 0 | 0 | 0 | #2 | W |
| C | 05, 02 | −04, +05 | 0 | 0 | 0 | 0 | #3 | N |
| D | 05, 03 | −04, +04 | 0 | 0 | 0 | 0 | #2 | W |
| E | 04, 03 | −03, +04 | 1 | 0 | 0 | 0 | #10 | W |
| F | 03, 03 | −02, +04 | 1 | 0 | 0 | 0 | #10 | W |
| G | 02, 03 | −01, +04 | 1 | 0 | 0 | 0 | #10 | W |
| H | 01, 03 | −00, +04 | 0 | 0 | 0 | 0 | #3 | N |
| I | 01, 04 | −00, +03 | 0 | 1 | 0 | 0 | #3 | N |
| J | 01, 05 | −00, +02 | 0 | 0 | 0 | 0 | #3 | N |
| K | 01, 06 | −00, +01 | 0 | 0 | 0 | 0 | #3 | N |
| L | 01, 07 | −00, +00 | 0 | 0 | 0 | 0 | #3 | N |

The first five sites agree with the fault free example noted above. However, at that point the end N exit is blocked so that the algorithm proceeds clockwise around the barrier of faults. The linkage scheme outlined above can easily be implemented in a programmable logic array by one skilled in the art of this type of technology.

The linking alrogithm set forth above can be implemented in a programmable logic array, i.e. logic 40 by a sum of products logic equations for both the sign and magnitude of the displacement address DA in both the X and Y coordinate directions by utilizing the variables set forth in Table II.

TABLE II

| TYPE VARIABLE | LOGIC SYMBOL | DESCRIPTION |
|---|---|---|
| internal | N | status of northern site |
| | E | status of eastern site |
| | S | status of southern site |
| | W | status of western site |
| internal | SOP1 | selected output port bit 1 |
| | SOP0 | selected output port bit 0 |
| input | SDX | sign of X displacement address |
| | DX | mag. of X displacement address (4 bits) |
| | DX3 | X displacement address bit 3 |
| | DX2 | X displacement address bit 2 |
| | DX1 | X displacement address bit 1 |
| | DX0 | X displacement address bit 0 |
| input | SDY | sign of Y displacement address (4 bits) |
| | DY3 | Y displacement address bit 3 |
| | DY2 | Y displacement address bit 2 |

TABLE II-continued

| TYPE | LOGIC SYMBOL | DESCRIPTION |
|---|---|---|
| | DY1 | Y displacement address bit 1 |
| | DY0 | Y displacement address bit 0 |
| output | OSDX | sign of X displacement address (4 bits) |
| | ODX3 | X displacement address bit 3 |
| | ODX2 | X displacement address bit 2 |
| | ODX1 | X displacement address bit 1 |
| | ODX0 | X displacement address bit 0 |
| output | OSDY | sign of Y displacement address (4 bits) |
| | ODY3 | Y displacement address bit 3 |
| | ODY2 | Y displacement address bit 2 |
| | ODY1 | Y displacement address bit 1 |
| | ODY0 | Y displacement address bit 0 |

A relatively simple relationship between the variables in Table II can be stated as follows:

$$DX = DX3, DX2, DX1, DX0 \quad (5)$$
$$DY = DY3, DY2, DY1, DY0 \quad (6)$$
$$\begin{aligned}SOP1 = &(/W \cdot SDX) + (/S \cdot /DX \cdot SDY) + \\ &(/S \cdot SDX \cdot SDY) + (/W \cdot /DX \cdot SDY) + \\ &(E \cdot /S \cdot SDY) + (N \cdot /S \cdot SDX) + (N \cdot E)\end{aligned} \quad (7)$$
$$\begin{aligned}SOP0 = &(/E \cdot /SDX \cdot DX) + (/E \cdot S \cdot /SDX \cdot SDY) + \\ &(/W \cdot SDX) + (S \cdot /W \cdot /DX \cdot SDY) + \\ &(N \cdot /E \cdot /SDX \cdot /SDY) + (N \cdot S) + \\ &(N \cdot /W \cdot /DX \cdot /SDY)\end{aligned} \quad (8)$$

Thus a selected output site I/O port E, W, N, S can be defined by the 2 bits of SOP as:

$$(SOP1, SOP0) = 00 = \text{NORTH} \quad (9)$$
$$(SOP1, SOP0) = 01 = \text{EAST} \quad (10)$$
$$(SOP1, SOP0) = 10 = \text{SOUTH} \quad (11)$$
$$(SOP1, SOP0) = 11 = \text{WEST} \quad (12)$$

Further, the following equations for the sign S and displacement DX magnitude can be defined as:

$$\begin{aligned}OSDX = &(SOP0 \cdot /SOP1 \cdot /DX3 \cdot /DX2 \cdot /DX1 \cdot /DX0) + \\ &(SOP0 \cdot /SOP1 \cdot SDX) + \\ &(SOP0 \cdot SDX \cdot DX1) + (SOP0 \cdot SDX \cdot DX2 + \\ &SOP0 \cdot SDX \cdot DX3) + (/SOP0 \cdot SDX)\end{aligned} \quad (13)$$

$$\begin{aligned}ODX3 = &(SOP0 \cdot DX3 \cdot DX0) + (SOP0 \cdot DX3 \cdot DX1) + \\ &(SOP0 \cdot DX3 \cdot DX2) + \\ &(SOP0 \cdot /SOP1 \cdot SDX \cdot DX2 \cdot DX1 \cdot DX0) + \\ &(SOP0 \cdot /SOP1 \cdot SDX \cdot DX3) + \\ &(SOP0 \cdot SOP1 \cdot /SDX \cdot DX2 \cdot DX1 \cdot DX0) + \\ &(SOP0 \cdot SOP1 \cdot /SDX \cdot DX3) + \\ &(/SOP0 \cdot DX3)\end{aligned} \quad (14)$$

$$\begin{aligned}ODX2 = &(SOP0 \cdot /SOP1 \cdot /SDX \cdot DX3 \cdot /DX2 \cdot /DX1 \cdot /DX0) + (SOP0 \cdot /SOP1 \cdot SDX \cdot /DX2 \cdot DX1 \cdot DX0) + (SOP0 \cdot SOP1 \cdot /SDX \cdot /DX2 \cdot DX1 \cdot DX0) + (SOP0 \cdot SOP1 \cdot SDX \cdot /DX2 \cdot /DX1 \cdot /DX0) + (SOP0 \cdot DX2 \cdot DX1 \cdot /DX0) + \\ &(SOP0 \cdot /SOP1 \cdot /SDX \cdot DX2 \cdot DX0) + \\ &(SOP0 \cdot /SOP1 \cdot SDX \cdot DX2 \cdot /DX1) + \\ &(SOP0 \cdot SOP1 \cdot /SDX \cdot DX2 \cdot /DX1) + \\ &(SOP0 \cdot SOP1 \cdot SDX \cdot DX2 \cdot DX0) + \\ &(/SOP0 \cdot DX2)\end{aligned} \quad (15)$$

$$\begin{aligned}ODX1 = &(SOP0 \cdot /SOP1 \cdot /SDX \cdot DX1 \cdot DX0) + \\ &(SOP0 \cdot /SOP1 \cdot /SDX \cdot DX2 \cdot /DX1 \cdot /DX0) + \\ &(SOP0 \cdot /SOP1 \cdot /SDX \cdot DX3 \cdot /DX1 \cdot /DX0 + \\ &(SOP0 \cdot /SOP1 \cdot SDX \cdot /DX1 \cdot DX0) + \\ &(SOP0 \cdot /SOP1 \cdot SDX \cdot DX1 \cdot /DX0) + \\ &(SOP0 \cdot SOP1 \cdot /SDX \cdot /DX1 \cdot DX0) + \\ &(SOP0 \cdot SOP1 \cdot /SDX \cdot DX1 \cdot /DX0) + \\ &(SOP0 \cdot SOP1 \cdot SDX \cdot DX1 \cdot DX0) + \\ &(SOP0 \cdot SOP1 \cdot SDX \cdot /DX1 \cdot /DX0) + \\ &(/SOP0 \cdot DX1)\end{aligned} \quad (16)$$

$$ODX0 = (SOP0 \cdot /DX0) + (/SOP0 \cdot DX0) \quad (17)$$

$$\begin{aligned}OSDY = &(/SOP0 \cdot /SOP1 \cdot /DY3 \cdot /DY2 \cdot /DY1 \cdot /DY0) + \\ &(/SOP0 \cdot /SOP1 \cdot SDY) + (/SOP0 \cdot SDY \cdot DY1) + \\ &(/SOP0 \cdot SDY \cdot DY2 + \\ &(/SOP0 \cdot SDY \cdot DY3) + (SOP0 \cdot SDY)\end{aligned} \quad (18)$$

$$\begin{aligned}ODY3 = &(/SOP0 \cdot DY3 \cdot DY0) + (/SOP0 \cdot DY3 \cdot DY1) + \\ &(/SOP0 \cdot DY3 \cdot DY2) + (/SOP0 \cdot /SOP1 \cdot SDY \cdot DY2 \cdot DY1 \cdot DY0) + (/SOP0 \cdot /SOP1 \cdot SDY \cdot DY3) + (/SOP0 \cdot SOP1 \cdot /SDY \cdot DY2 \cdot DY1 \cdot DY0) + (/SOP0 \cdot SOP1 \cdot /SDY \cdot DY3) + \\ &(SOP0 \cdot DY3)\end{aligned} \quad (19)$$

$$\begin{aligned}ODY2 = &(/SOP0 \cdot /SOP1 \cdot SDY \cdot DY3 \cdot /DY2 \cdot /DY1 \cdot /DY0) + (/SOP0 \cdot /SOP1 \cdot SDY \cdot /DY2 \cdot DY1 \cdot DY0) + (/SOP0 \cdot SOP1 \cdot /SDY \cdot /DY2 \cdot DY1 \cdot DY0) + (/SOP0 \cdot SOP1 \cdot SDY \cdot /DY2 \cdot /DY1 \cdot /DY0) + (/SOP0 \cdot DY1 \cdot /DY0) + \\ &(/SOP0 \cdot /SOP1 \cdot SDY \cdot DY2 \cdot DY0) + \\ &(/SOP0 \cdot /SOP1 \cdot SDY \cdot DY2 \cdot /DY1) + \\ &(/SOP0 \cdot SOP1 \cdot /SDY \cdot DY2 \cdot /DY1) + \\ &(/SOP0 \cdot SOP1 \cdot SDY \cdot DY2 \cdot DY0) + \\ &(SOP0 \cdot DY2)\end{aligned} \quad (20)$$

$$\begin{aligned}ODY1 = &(/SOP0 \cdot /SOP1 \cdot SDY \cdot DY1 \cdot DY0) + \\ &(/SOP0 \cdot /SOP1 \cdot SDY \cdot DY2 \cdot /DY1 \cdot /DY0) + \\ &(/SOP0 \cdot /SOP1 \cdot SDY \cdot DY3 \cdot /DY1 \cdot /DY0) + \\ &(/SOP0 \cdot /SOP1 \cdot SDY \cdot /DY1 \cdot DY0) + \\ &(/SOP0 \cdot /SOP1 \cdot SDY \cdot DY1 \cdot /DY0) + \\ &(/SOP0 \cdot SOP1 \cdot /SDY \cdot /DY1 \cdot DY0) + \\ &(/SOP0 \cdot SOP1 \cdot /SDY \cdot DY1 \cdot /DY0) + \\ &(/SOP0 \cdot SOP1 \cdot SDY \cdot DY1 \cdot DY0) + \\ &(/SOP0 \cdot SOP1 \cdot SDY \cdot /DY1 \cdot /DY0) + \\ &(SOP0 \cdot DY1)\end{aligned} \quad (21)$$

$$ODY0 = (/SOP0 \cdot /DY0) + (SOP0 \cdot DY0) \quad (22)$$

Figure 6:
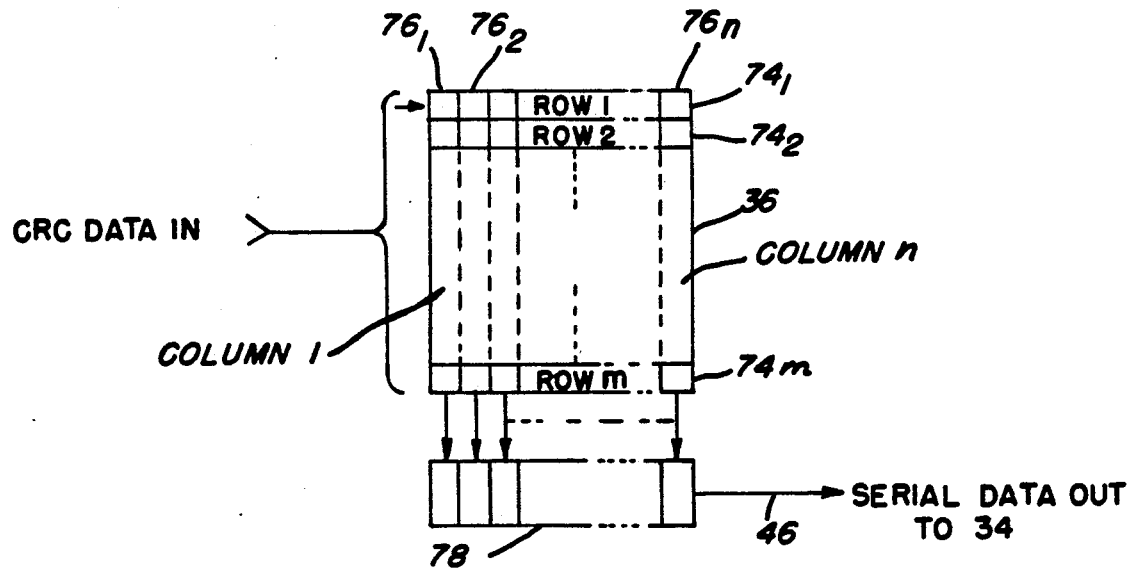
FIG. 6 is an electrical block diagram illustrative of the data utilization by each memory array included in the memory and logic sites shown in FIG. 2.

Given that a specified site can be accessed via a linking process described above, the contents of the memory cells in the array 36 will now be considered. The data to be stored in each site 12 can be in the order of 1000 to 8000 bits long. Referring to FIG. 6, each memory cell array of a site 12 comprises a conventional row and column arrangement of cells consisting of m rows $74_1, 74_2 \ldots 74_m$ and n columns $76_1, 76_2 \ldots 76_n$ wherein each row $74_1$ contains a complete data block. On read out, the contents of a row are transferred in parallel to a shift register 78. The shift register is then used to shift the data serially to the bi-directional in/output data bus 37 shown in FIG. 2. It should be recognized that all of the rows $74_1 \ldots 74m$ of the memory cell array 36 in an accessible site 12 may not be functional. In any case, the utilization of available memory cells can be enhanced by using available operating rows without restriction as to which site is involved. To accomplish this it is merely necessary that the external controller 22 keep track of the data blocks with only an incidental note as to site location.

Further, each memory cell array 36 uses an address translator approach whereby it has a specific target storage capacity, wherein the capacity or quantity of data blocks occupy a sequential logical address space. Corresponding to each logical address, there will be a physical address. The physical address contains a description as to which site and which row must be accessed. The logical to physical address map is established by testing to confirm the operability of physical addresses. This process can be done once during fabrication and captured in a ROM, for example. Alternatively, the mapping can be conducted electronically in system. As an arbitrary example, consider the possibility of a system consisting of four FW-NVM 10 being interconnected together to a common host computer and controller 22. Assuming that each memory cell array 36 within each site contains 1024 rows to accommodate 1024 blocks of information and that 200 sites 12 exist on each wafer 10, a physical address for such a system would require 20 bits, which could take the form:

| 19 18 | 17 ... 11 10 | 09 08 ... 02 01 00 |
|-------|--------------|---------------------|
| wafer I.D. | site I.D. | block I.D. |

This system would result in the number of blocks available being in the range between 800,000 and 1,000,000. Assuming that at least 40% of the blocks are available, 335.5M bits of storage are available.

A third segment of the inventive concept of the invention comprises the encoding of the block data for fault tolerance. A block of data is loaded into the memory cell array 36 in a serial stream which contains, for example, 1024 bits. An efficient arrangement of the bits is to encode the data using a cyclical redundancy code (CRC). This type of coding is well known and has been utilized heretofore with magnetic tapes, magnetic bubbles and magnetic disks. CRCs have an orderly mathematical structure and are easy to encode and decode using linear feedback shift registers. Commercially available integrated circuits have been developed and are presently available to perform these functions. CRC codes also permit the detection and correction of failures and the accomplishment of self test procedure. The price that is paid is that the block size must be increased to accommodate storage of the redundancy bits. The advantage to be gained, however, is that column errors within a site can be masked. Moreover, the CRC error detection and correction functions are integrated as part of the external controller circuitry 22. However, such functions can be implemented into the control circuitry 44 within each of the sites.

Having thus shown and described a full-wafer nonvolatile memory which is capable of tolerating localized manufacturing and/or material defects and which is at present considered to be the preferred embodiment of the invention, it should be noted that the same has been made by way of illustration and not limitation. Accordingly, all modifications, alterations and changes coming within the spirit and scope of the invention as set forth in the appended claims are herein meant to be included.

I claim:

1. A method of randomly accessing a memory-logic site of a plurality of said sites on a full wafer nonvolatile memory, comprising the steps of:
   (a) determining the address of a desired memory-logic site to be accessed;
   (b) coupling a source of binary control and data signals to a non-defective site of said array;
   (c) determining and loading into memory of said non-defective site the displacement address thereof, said displacement address being the difference between the site address of said desired site and the site address of said non-defective site;
   (d) testing all said sites immediately adjacent said non-defective site for other non-defective sites;
   (e) linking to an immediately adjacent other non-defective site;
   (f) incrementing or decrementing the displacement address of said non-defective site and generating a new displacement address corresponding to said adjacent non-defective site;
   (g) loading said new displacement address into memory of said adjacent site; and
   (h) thereafter repeating said steps (c) through (g) in sequence for each subsequent non-defective site until said displacement address is of a predetermined difference value indicative of said desired site, whereby a communications path is provided to said desired site.

2. The method of claim 1 wherein said plurality of said sites are arranged in an array and wherein said coupling step (b) comprises coupling to a non-defective site on the outer edge of said array.

3. The method of claim 2 and additionally including the step of initially testing the array of sites for defective and non-defective sites.

4. A method of randomly accessing a memory-logic site of a rectilinear array of said sites on a full wafer nonvolatile memory, comprising the steps of:
   (a) testing the operational integrity of all said sites and each input/output port thereof;
   (b) setting fault status flags to a predetermined state at each said port of malfunctioning or defective sites of said array of sites;
   (c) determining the address of a desired memory-logic site to be accessed;
   (d) coupling a source of binary control and data signals to an input/output port of a non-defective site of said array;
   (e) determining and loading into memory of said non-defective site the displacement address thereof, said displacement address being the difference between the site address of said desired site and the site address of non-defective site;
   (f) testing all the sites immediately adjacent said non-defective site by sensing the state or respective fault status flags of the input/output ports of said adjacent sites;
   (g) sensing the status of the input/output port having a no fault status of a most favorable site of said adjacent sites relative to said desired site;
   (h) coupling or linking to said most favorable site via an adjacent input/output ports;
   (i) incrementing or decrementing the displacement address of said non-defective site and generating a new displacement address corresponding to said most favorable site;
   (j) loading said new site displacement address into memory of said most favorable site; and
   (k) thereafter repeating said steps (e) through (j) in sequence for each subsequent non-defective site until said displacement address is of a predetermined difference value indicative of said desired site, whereby a communications path is provided for translating signals to said desired site.

5. The method of claim 4 wherein said coupling step (d) comprises coupling to a non-defective site on the outer portion of said array of sites.

6. The method of claim 4 wherein said coupling step (d) comprises coupling to a non-defective site on the outer edge of said array of sites.

7. The method of claim 4 wherein said coupling step (d) comprises coupling to an outermost non-defective site of said array of sites.

8. The method of claim 7 wherein said coupling step (d) comprises coupling to a wafer input/output channel on the edge of said full wafer nonvolatile memory prior to coupling to said outermost non-defective site.

9. The method of claim 8 wherein said input/output channel comprises one of four wafer input/output ports respectively located on the outer perimeter of said full wafer nonvolatile memory.

10. The method of claim 9 wherein said four wafer input/output channels are located in quadrature around said array.

11. A full wafer nonvolatile memory, comprising:
(a) a matrix array of identical memory-logic sites including memory means and logic means located on a common wafer;
(b) a source of binary control and data signals;
(c) means for determining the address of a desired memory-logic site on said wafer;
(d) means for coupling said source of binary control and data signals to a non-defective site of said array;
(e) means in each said memory-logic site for determining and loading into memory of said non-defective site a displacement address of said non-defective site, said displacement address being the difference between the site address of said desired site and the site address of said non-defective site;
(f) means in each said site for testing all the sites adjacent said non-defective site for defective and non-defective sites;
(g) means in each said non-defective site for linking to an adjacent non-defective site;
(h) said means for determining and loading a displacement address further comprising means for incrementing and decrementing the displacement address of said non-defective site and generating a new displacement address corresponding to said adjacent non-defective site; and
(i) means in each site for loading said new displacement address into memory of said adjacent site,
whereby a communication path is adaptively generated from said source of binary control and data signals to said desired site by a sequential linking from site to site around defective sites.

12. The full wafer nonvolatile memory of claim 11 wherein said memory means of said memory-logic sites comprises a memory cell array and a cell address circuit therefore.

13. The full wafer nonvolatile memory of claim 11 wherein said logic means of said memory-logic comprises a programmable logic array.

14. The full wafer nonvolatile memory of claim 11 wherein said coupling means (d) includes a wafer input/output channel.

15. The full wafer nonvolatile memory of claim 11 wherein said coupling means (d) comprises one of four orthogonally located wafer input/output channels located along the outer perimeter of said wafer.

16. A digital memory fabricated on a wafer of semiconductor material comprising:
(a) a rectangular array of identical memory-logic sites having four input/output site ports respectively located on four sides of each said site and being mutually opposite a like input/output site port of an immediately adjacent said site;
(b) means for coupling mutually opposite input/output site ports of said sites;
(c) a wafer input/output channel located on each side of said array and being coupled to at least one input/output site port of a side memory-logic site facing said wafer input/output channel; and
(d) means for selectively coupling a source of digital control and data signals to each said wafer input/output channel.

17. The digital memory of claim 16 wherein each said wafer input/output channel (c) is coupled to one input/output site port of two said memory-logic sites of the outer most sites of said array (a) adjacent said wafer input/output channel.

18. The digital memory of claim 16 wherein said said memory-logic site further comprises:
(i) input/output circuit means commonly coupled to said four input/output site ports;
(ii) a nonvolatile array of memory cells having a bidirectional data bus coupled to said input/output circuit means;
(iii) memory address circuit means coupled to said array of memory cells for accessing the memory cells to load and unload digital data therefrom;
(iv) logic circuit means and a set of status registers therefore coupled between said input/output circuit means and said memory address circuit means; and
(v) control circuit means coupled between said input/output circuit means, and said memory address circuit means, said logic circuit means, and said status registers for internally testing the respective site and effecting a linking to an adjacent site for generating a fault tolerant communications path between a predetermined end memory-logic site and an external source of control and data signals.

19. The digital memory of claim 18 wherein said logic circuit means and said set of status registers comprise a programmable logic array.

20. The digital memory of claim 18 wherein said external source of control and data signals comprise an external controller coupled to a digital computer.

* * * * *